United States Patent [19]

Frederich

[11] Patent Number: 4,800,508

[45] Date of Patent: Jan. 24, 1989

[54] FREQUENCY DETECTOR

[75] Inventor: William L. Frederich, Kenosha, Wis.

[73] Assignee: Eaton Corporation, Cleveland, Ohio

[21] Appl. No.: 880,531

[22] Filed: Jun. 30, 1986

[51] Int. Cl.⁴ .............................................. G01R 23/00
[52] U.S. Cl. .................................. 364/484; 324/78 D; 324/78 R
[58] Field of Search ........... 364/484; 324/78 R, 78 D; 377/50; 328/140; 307/234, 572

[56] References Cited

U.S. PATENT DOCUMENTS

| | | |
|---|---|---|
| 3,609,326 | 1/1969 | Bagley et al. . |
| 4,027,146 | 6/1970 | Gilmore . |
| 4,052,620 | 10/1977 | Brunnett . |
| 4,396,884 | 8/1983 | Toalson . |
| 4,458,194 | 7/1984 | Geppert et al. . |
| 4,484,137 | 11/1984 | Chang . |
| 4,517,548 | 5/1985 | Ise et al. . |
| 4,517,669 | 5/1985 | Freeburg et al. . |
| 4,517,679 | 5/1985 | Clark et al. . |
| 4,520,359 | 5/1985 | Kitagawa et al. . |
| 4,541,105 | 9/1971 | Lee et al. . |

FOREIGN PATENT DOCUMENTS

| | | |
|---|---|---|
| 1196907 | 7/1967 | United Kingdom . |
| 1466213 | 3/1974 | United Kingdom . |
| 2052192 | 2/1980 | United Kingdom . |
| 2070363 | 5/1980 | United Kingdom . |
| 8504487 | 10/1985 | World Int. Prop. O. . |

Primary Examiner—Emanuel S. Kemeny
Attorney, Agent, or Firm—M. L. Union

[57] ABSTRACT

Method and apparatus for determining a frequency of a series of signals. A pulse train whose frequency is to be measured is counted. The time that the counting takes place is varied to coincide with the occurrence of a beginning and an ending pulse. The pulse count is then divided by the time to give the measured frequency in hertz. The system is useful in a tachometer motor controller system.

2 Claims, 2 Drawing Sheets

FREQUENCY DETECTOR

TECHNICAL FIELD

The present invention relates to a frequency detector that accurately determines a frequency from a sequence of repetitive signals.

BACKGROUND ART

The frequency of a repetitive signal has typically been measured using one of two methods The most commonly used method is to set up a time interval and count the number of pulses which occur during that interval. A disadvantage of this method is that when the frequency is low and only a few pulses occur during the time interval, the accuracy is low since one cannot resolve partial pulses. One solution to this problem is to increase the time interval so that many pulses occur during the time interval regardless of the frequency. This frequency measuring method is not suitable, however, when used in a system which requires a rapid update of the measured frequency.

A second frequency measuring method measures the time between pulses (period) and converts this measurement into a frequency. This method overcomes the disadvantage associated with the method described above but poses another disadvantage. When the frequency is high, the time between pulses must be measured to a high degree of accuracy. This is not always possible because the method used to measure time cannot always be that accurate For example, when working with a microprocessor using a 1 MHz. clock frequency, the most accurately one can measure a period is to 1 microsecond. Often this is not accurate enough when measuring frequencies above 1 Khz.

U.S. Pat. No. 4,052,620 to Brunnett discloses a variation of a constant time interval frequency determination method. That patent shows apparatus for conducting a computed tomography (CT) scan of a patient An x-ray intensity is determined by converting an analog electrical output from radiation photo detectors into a series of pulses whose frequency is proportional to the radiation intensity.

The Brunnett apparatus establishes a primary time Period based on the scan time of the scanner During this primary period, a variable frequency is generated which corresponds to an analog signal from the photodetectors What is desired is the average value of the signal during the primary period of the scan. A secondary period is generated which starts on the first pulse after the primary period starts and ends on the last pulse before the primary period ends. The actual frequency of the pulses at any one time is of no interest, only the average during the primary period. The secondary period is the largest period available which can be synchronized to the pulses and will fit inside of the primary period.

DISCLOSURE OF THE INVENTION

A new and improved frequency detection method and apparatus is disclosed wherein repetitive signals are counted during a time interval that is synchronized to start when a pulse occurs. After the time interval is over, the time is measured until a next succeeding pulse occurs. These time and count determinations provide sufficient information to calculate the frequency of the repetitive signals.

As a first step of the frequency determination a time period is chosen based upon the resolution desired. The pulses are counted beginning with the first pulse occurring within the period and ending with a next succeeding pulse after the end of the time period. The time between the beginning and ending pulses is divided into the count to give a calculated frequency.

One advantage to this method is that it works for frequencies over a wide range and is more accurate than the prior art methods At high frequencies many pulse are counted to provide more accuracy. At low frequencies, partial pulses do not create a problem since the time base is lengthened and always starts and ends on a pulse.

A preferred application of the invention is for use with an automatic speed control for a continuously variable speed motor. The frequency of a series of pulses whose repetition rate is proportional to the motor speed is determined and compared with a control input. To rapidly adjust motor speed the frequency is constantly updated and fed back to the motor control.

For this preferred application, where constant frequency updating is a necessity, the end of each counting period begins a next succeeding counting period The time for each period varies due to the synchronization of pulses to take advantage of the improved accuracy at both high and low frequencies.

One system where the invention has applicability is described in U.S. Pat. No. 4,458,194 to Geppert et al entitled "Method and Apparatus for Pulse Width Modulation Control of an AC Induction Motor." The disclosure of this patent is incorporated herein by reference.

One object of the invention is to accurately determine a frequency regardless of whether the frequency is high or low This and other objects, advantages and features of the invention will become better understood from a review of a detailed description of one embodiment of the invention described in conjunction with the accompanying drawings.

BEST MODE FOR CARRYING OUT THE INVENTION

Figure 1:
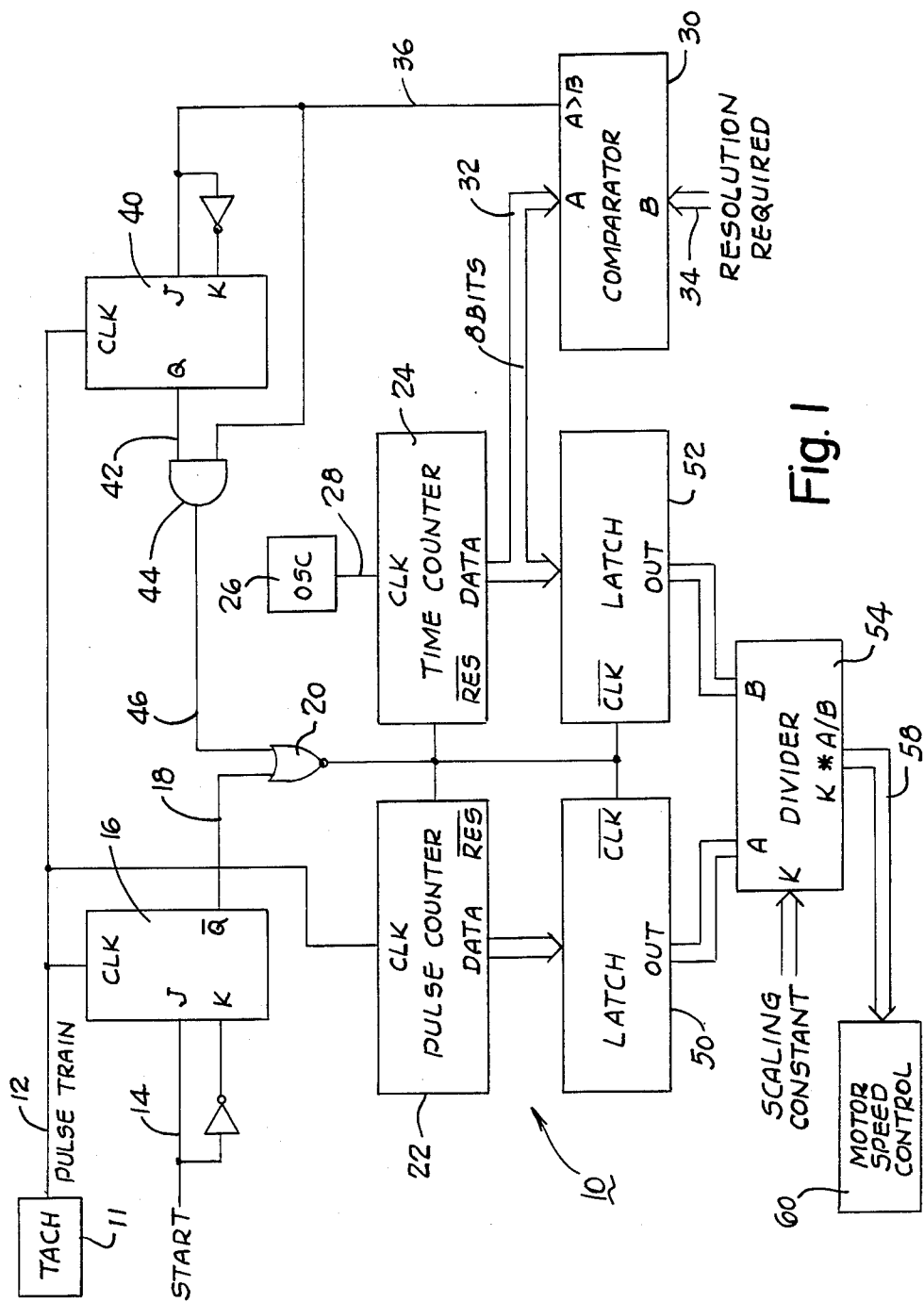
FIG. 1 is a schematic of a circuit for implementing a preferred frequency measuring method and apparatus.

Turning now to the drawings, FIG. 1 depicts circuitry 10 suitable for implementing the invention. Although the invention is described in conjunction with this hard wired circuit, it is within the scope of the invention for the frequency determination to be implemented by a microprocessor controlled frequency measuring system.

Figure 2A:
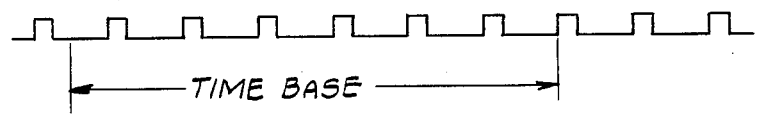
FIG. 2A and 2B illustrate prior art frequency measuring techniques.
Figure 2B:
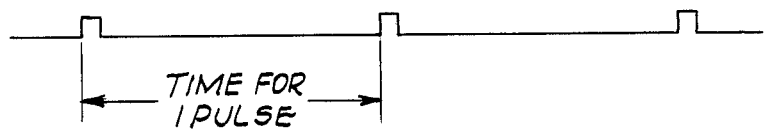

FIGS. 2A and 2B illustrate two prior art techniques for determining the frequency of a sequence of pulses In the FIG. 2A embodiment, a fixed time base is chosen for determining a frequency and the number of pulses occurring within that time base are counted. The number of pulses is divided by the time base to give a frequency.

In FIG. 2B, a time period between pulses is determined. This period is inversely related to the frequency of pulses and therefore a measurement of the time period gives an indication of the frequency. Each of these techniques has disadvantages and it is a object of the invention to overcome these difficulties by implementing a procedure which is more accurate for both high frequencies and for relatively low frequency signals.

Figure 2C:
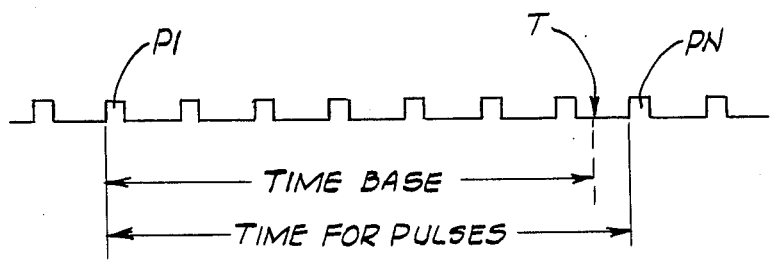
FIGS. 2C and 2D illustrate the method for determining frequency embodied by the present invention.

In accordance with the invention (FIGS. 2C and 2D), a time base is chosen for measurements. This time base is not constant as was the case for the prior art technique illustrated in FIG. 2A. Instead, the length of the time base is chosen depending upon the required resolution of the frequency determination. As seen in FIG. 2C, the time base begins upon the receipt of a pulse P1 and ends at a certain time T. The timing for frequency calculations continues until the receipt of the next pulse PN after the time T. The pulses P1 through PN are counted and the time period is the time separating the first and last pulses P1, PN. The frequency is calculated by dividing the number of pulses less 1 (count-1) by the time between P1 and PN.

Figure 2D:
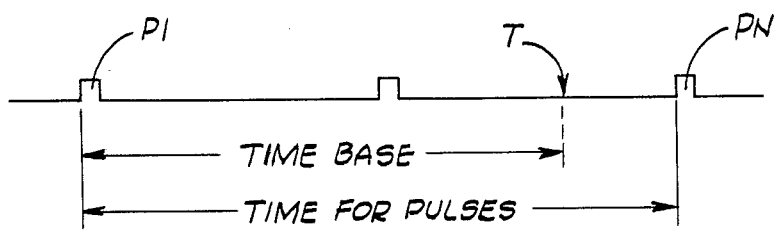

Turning now to FIG. 2D, that figure illustrates circumstances in which a number of pulses occurring within the time period is low. The time base begins upon the receipt of the pulse P1 and ends upon receipt of the next pulse subsequent to the time T. The next succeeding pulse PN delineates the time variable for the frequency calculation and the number of pulses (count-1) (in this instance 2) is divided by that time period. Even if the time base expires before the receipt of a next succeeding pulse, a measurement can be obtained. This situation is seen to be fully equivalent to the situation in FIG. 2B where the period is determined and used to calculate the frequency.

Turning now to FIG. 1, a schematic diagram for apparatus to implement the invention is described. A series of pulses are coupled to an input 12 of the schematic circuit 10. These pulses may, as an example, be generated by a tachometer 11 that monitors an alternating current motor having a speed that is directly proportional to the pulse repetition rate. The frequency calculation is used as part of a servo speed control.

The series of pulses are digital signals that are either "on" or "off". "Off" typically corresponds to zero volts or system ground and "on" to a few volts (often 5) higher than the "off" voltage The term "low" and "high" are used interchangeably with "off" and "on".

When a start input 14 goes high frequency determinations begin. During normal operation of the circuit 10, this input remains high. Receipt of a high signal at the input 14 causes an inverting output 18 from a flip flop circuit 16 to go low synchronized with a low to high transition of the pulse train 12. This output 18 is coupled to a NOR gate 20 whose output goes high, releasing the reset input to two counters 22, 24.

A first counter 22, counts pulses as they are received at the pulse train input 12. The second counter 24 is a timing counter driven by an oscillator 26 coupled to a clock input 28 of the counter 24. As the reset input from the gate 20 releases these two counters, the pulse counter begins counting pulses (beginning with the next pulse after the one that released the counter reset) and the time counter begins timing of the receipt of those pulses.

The circuit 10 additionally includes a comparator 30 having two inputs 32, 34. The input 34 is a variable time base input for setting the time base shown in FIGS. 2C, 2D and can be varied as the measured frequency resolution requirements change.

The time counter 24 generates a digital output (8 bits) that is coupled to the input 32 and compared to the time base input 34. When the two are equal, a comparator output 36 goes high and is coupled to a second flip-flop 40 that is also clocked by the pulse train 12. This flip-flop 40 has an noninverting output 42 coupled to an AND gate 44 whose output is coupled to the NOR gate 20. The output 42 is therefore synchronized with the next succeeding pulse in the pulse train input 12. A high signal at an output 46 from the AND gate 44 causes the NOR gate 20 to go low, resetting the counter 22 and timer 24. At the same time, the low output from the gate 20 causes two latches 50, 52 to latch the count in both the pulse counter 22 and the time counter 24 Note that each pulse that resets the counters is not included in the count in the next succeeding base period since the latch 50 gathers that pulse in the previous base period.

A divider circuit 54 receives a count output from the latch 50 and divides it by the time output from the latch 52. Since the output from the counter 24 is a digital record of the clock pulses received in the counting period a scaling input 56 is required by the divider 54 to produce a digital output 58 of the pulse frequency in hertz.

The digital output 58 is coupled to a motor speed control 60. The speed control 60 compares the calculated frequency (or speed) with a control frequency (or speed). The control 60 energizes the motor (not shown) to reduce differences between the calculated frequency and the control frequency.

The output from the gate 20 that causes the latches 50, 52 to gather data from the counters 22, 24 also resets those counters. As soon as the time counter 24 is reset, the. comparator 30 senses a nonequality between the inputs 32, 34 and causes the output 36 to go low. This low output is coupled to the AND gate 44 causing the output 46 to go low. This releases the reset from the gate 20 until receipt of a next subsequent output from the comparator 30. The two counters 22, 24 again begin counting pulses and time for a next succeeding time period. The frequency calculation is continually updated after passage of a base period time controlled by the input 34.

As noted above, the invention could be implemented using a microprocessor having an internal timer whose value is continually updated at the microprocessor clock frequency. A programmed time base value is compared with the elapsed time on the counter as microprocessor interrupt pulses from the pulse train are counted. A correspondence between the clock output and the time base indicator would cause the timers to end on the next succeeding interrupt pulse. In this way, the same frequency information i.e., the count and the time is obtained. The frequency is then calculated by the microprocessor.

While the present invention has been described with a degree of particularity, it is the intent that both the hard wired system of FIG. 1 and a software embodiment utilizing a microprocessor controller be protected. It is therefore the intent that the invention include all modifications and/or alterations from the disclosed design falling within the spirit or scope of the appended claims.

I claim:

1. Apparatus for controlling the speed of a variable speed motor comprising:
   tachometer means for converting a rotational output from said motor into a sequences of pulses having a pulse repetition frequency related to the motor speed;

set means for setting a base time period;

timing means for timing an extended time period which includes said base time period, said timing means initiating said extended and base time periods upon receipt of an initial pulse from said tachometer means;

said timing means for stopping said extended timing period upon the occurrence of the first pulse subsequent to the expiration of said base time period;

counting means for counting the occurrence of tachometer pulses between said initial pulse and said first pulse subsequent to the expiration of said base time period;

calculating means for determining a repetitive pulse frequency based upon the count of said counting means and the extended time period overwhich the count is determined; and motor control means coupled to said calculating means to adjust the speed of said motor by comparing a desired motor speed with a sensed motor speed as indicated by said calculated pulse frequency.

2. Apparatus for use in a motor control for determining a frequency of a sequence of repetitive pulses comprising:

set means for setting an adjustable base period;

said set means comprises comparator means having means for storing said adjustable base period;

timing means to begin a timing period upon receipt of a first pulse, to generate a stop signal after the adjustable base period, and to continue timing said timing period until the occurrence of a subsequent pulse after the end of said base period;

said timing means including a timer having a continuously running output that is started and reset by receipt of pulses in said sequence and where the continuously running output of said timing means is compared to the base period by said comparator means to generate said stop signal;

counting means for determining a count of pulses during said timing period;

wherein said counting means counts said first pulse but does not count said subsequent pulse in said count of pulses; and calculating means for determining a repetitive pulse frequency based upon the count of said counting means and timing period over which the count is determined.

* * * * *